United States Patent
Chang et al.

(10) Patent No.: US 10,868,189 B2
(45) Date of Patent: Dec. 15, 2020

(54) SEMICONDUCTOR DEVICE AND MANUFACTURING METHOD THEREOF

(71) Applicant: TAIWAN SEMICONDUCTOR MANUFACTURING COMPANY LIMITED, Hsin-Chu (TW)

(72) Inventors: Che-Cheng Chang, New Taipei (TW); Chih-Han Lin, Hsinchu (TW); Horng-Huei Tseng, HsinChu (TW)

(73) Assignee: Taiwan Semiconductor Manufacturing Company Limited, Hsin-chu (TW)

( * ) Notice: Subject to any disclaimer, the term of this patent is extended or adjusted under 35 U.S.C. 154(b) by 0 days.

(21) Appl. No.: 16/205,333

(22) Filed: Nov. 30, 2018

(65) Prior Publication Data

US 2019/0109236 A1    Apr. 11, 2019

Related U.S. Application Data

(63) Continuation of application No. 15/715,100, filed on Sep. 25, 2017, now Pat. No. 10,153,374, which is a continuation of application No. 15/089,380, filed on Apr. 1, 2016, now Pat. No. 9,773,912.

(60) Provisional application No. 62/288,238, filed on Jan. 28, 2016.

(51) Int. Cl.
*H01L 29/78* (2006.01)
*H01L 29/66* (2006.01)
*H01L 29/76* (2006.01)

(52) U.S. Cl.
CPC .... *H01L 29/7856* (2013.01); *H01L 29/66545* (2013.01); *H01L 29/66795* (2013.01); *H01L 29/785* (2013.01)

(58) Field of Classification Search
CPC .......... H01L 29/7856; H01L 29/66545; H01L 29/66795
See application file for complete search history.

(56) References Cited

U.S. PATENT DOCUMENTS

| | | | |
|---|---|---|---|
| 9,041,125 B2 | 5/2015 | Lin et al. | |
| 9,331,074 B1 | 5/2016 | Chang et al. | |
| 9,443,853 B1 * | 9/2016 | Cheng | H01L 27/0924 |
| 9,461,043 B1 | 10/2016 | Chang et al. | |
| 9,704,753 B2 * | 7/2017 | Cheng | H01L 27/0924 |
| 2005/0228647 A1 | 10/2005 | Fisher | |
| 2006/0138553 A1 * | 6/2006 | Brask | H01L 21/845 257/369 |
| 2012/0139054 A1 * | 6/2012 | Yin | H01L 21/28114 257/369 |
| 2012/0254817 A1 * | 10/2012 | Sherlekar | G06F 17/5068 716/119 |

(Continued)

FOREIGN PATENT DOCUMENTS

CN    105845578 A    8/2016

*Primary Examiner* — Christine A Enad
(74) *Attorney, Agent, or Firm* — Cooper Legal Group, LLC

(57) ABSTRACT

A semiconductor device includes a substrate, at least one active region, at least one gate structure, and an insulating structure. The active region is present at least partially in the substrate. The gate structure is present on the active region. The gate structure has at least one end sidewall and a top surface intersecting to form a top interior angle. The top interior angle is an acute angle. The insulating structure is present adjacent to the end sidewall of the gate structure and on the substrate.

20 Claims, 10 Drawing Sheets

(56) References Cited

U.S. PATENT DOCUMENTS

| | | | |
|---|---|---|---|
| 2014/0227848 A1* | 8/2014 | Kang | H01L 21/823431 438/283 |
| 2014/0252486 A1* | 9/2014 | Lin | H01L 29/66795 257/365 |
| 2015/0228544 A1 | 8/2015 | Lin et al. | |
| 2015/0228647 A1 | 8/2015 | Chang et al. | |
| 2015/0236159 A1* | 8/2015 | He | H01L 29/66795 257/401 |
| 2016/0181425 A1* | 6/2016 | Bai | H01L 29/66818 438/283 |
| 2016/0300755 A1* | 10/2016 | Gan | H01L 21/76224 |
| 2017/0110554 A1* | 4/2017 | Tak | H01L 29/4991 |

* cited by examiner

SEMICONDUCTOR DEVICE AND MANUFACTURING METHOD THEREOF

PRIORITY CLAIM AND CROSS-REFERENCE

This application is a continuation of U.S. patent application Ser. No. 15/715,100, titled "SEMICONDUCTOR DEVICE AND MANUFACTURING METHOD THEREOF" and filed on Sep. 25, 2017, which is a continuation of U.S. patent application Ser. No. 15/089,380, titled "SEMICONDUCTOR DEVICE AND MANUFACTURING METHOD THEREOF" and filed on Apr. 1, 2016, which claims priority to U.S. Provisional Application Ser. No. 62/288,238, titled "SEMICONDUCTOR DEVICE AND MANUFACTURING METHOD THEREOF" and filed on Jan. 28, 2016. U.S. patent application Ser. No. 15/715,100, U.S. patent application Ser. No. 15/089,380, and U.S. Provisional Application Ser. No. 62/288,238 are incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction substantially normal to the plane of the substrate. The channel of the FET is formed in this fin. A gate is provided over (e.g., wrapping) the fin. The FinFETs can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 9A are top views of a method for manufacturing a semiconductor device at various stages in accordance with some embodiments of the present disclosure.

FIGS. 1B to 9B are cross-sectional views respectively taking along line B-B of FIGS. 1A to 9A.

DETAILED DESCRIPTION

Figure 1A:
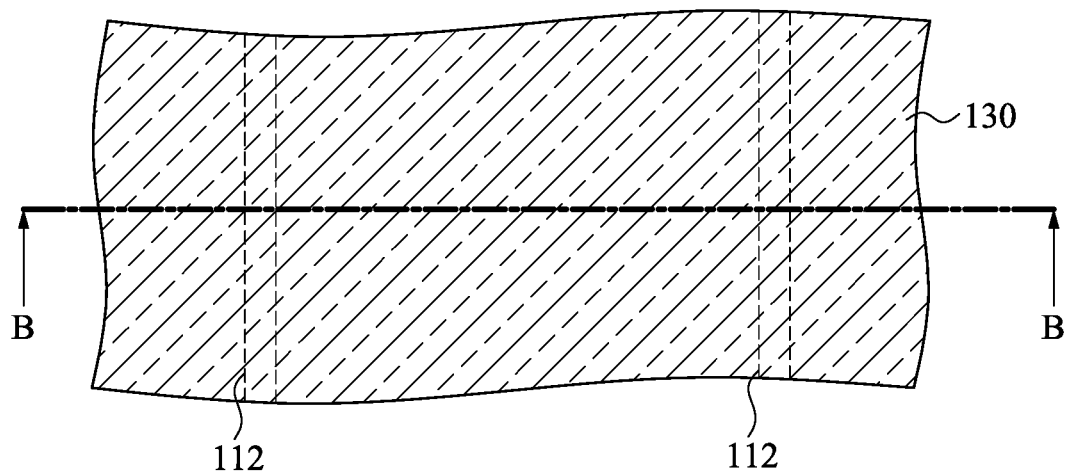

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present disclosure may be used with other configurations.

Figure 1B:
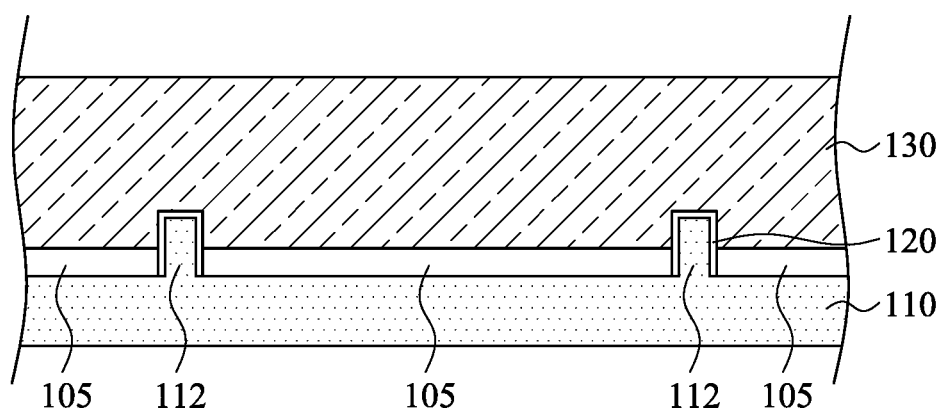

FIGS. 1A to 9A are top views of a method for manufacturing a semiconductor device at various stages in accordance with some embodiments of the present disclosure, and FIGS. 1B to 9B are cross-sectional views respectively taking along line B-B of FIGS. 1A to 9A. Reference is made to FIGS. 1A and 1B. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

At least one semiconductor fin 112 is formed on the substrate 110. For example, in FIGS. 1A and 1B, there are two semiconductor fins 112. In some embodiments, the semiconductor fins 112 include silicon. The semiconductor fins 112 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a desired pattern (the semiconductor fins 112 in this case) and developed to remove portions of the photoresist material. The remaining photoresist material protects the underlying material from subsequent processing steps, such as etching. It should be noted that other masks, such as an oxide or silicon nitride mask, may also be used in the etching process. In some other embodiments, the semiconductor fins 112 may be epitaxially grown. For example, exposed portions of an underlying material, such as an exposed portion of the substrate 110, may be used in an epitaxial process to form the semiconductor fins 112. A mask may be used to control the shape of the semiconductor fins 112 during the epitaxial growth process. Moreover, it is note that the numbers of the semiconductor fins 112 in FIGS. 1A and 1B are illustrative, and should not limit the claimed scope of the present disclosure. A person having ordinary skill in the art may select suitable numbers for the semiconductor fins 112 according to actual situations.

A plurality of isolation structures 105 are formed on the substrate 110. The isolation structures 105, which act as a shallow trench isolation (STI) around the semiconductor fins 112, may be formed by chemical vapor deposition (CVD) techniques using tetra-ethyl-ortho-silicate (TEOS) and oxygen as a precursor. In some other embodiments, the isolation structures 105 may be formed by implanting ions, such as oxygen, nitrogen, carbon, or the like, into the substrate 110. In yet some other embodiments, the isolation structures 105 are insulator layers of a SOI wafer.

An interlayer dielectric 120 is formed to cover the semiconductor fins 112. The interlayer dielectric 120 may be formed by thermal oxidation, chemical vapor deposition, sputtering, or other methods known and used in the art for forming a gate dielectric. Depending on the technique of dielectric layer formation, the thickness of the interlayer dielectric 120 on the top of the semiconductor fins 112 may be different from the thickness of the interlayer dielectric 120 on the sidewall of the semiconductor fins 112. The interlayer dielectric 120 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The interlayer dielectric 120 may have a multilayer structure such as one layer of silicon oxide (e.g., interfacial layer) and another layer of high-k material. The interlayer dielectric 120 may be formed using chemical vapor deposition (CVD), physical vapor deposition (PVD), atomic layer deposition (ALD), thermal oxide, ozone oxidation, other suitable processes, or combinations thereof.

A dummy gate layer 130 is formed on the interlayer dielectric 120 and the substrate 110. The dummy gate layer 130 may be deposited by chemical vapor deposition (CVD), by sputter deposition, or by other techniques known and used in the art for depositing conductive materials. The dummy gate layer 130 may include polycrystalline-silicon (poly-Si) or poly-crystalline silicon-germanium (poly-SiGe).

Figure 2A:
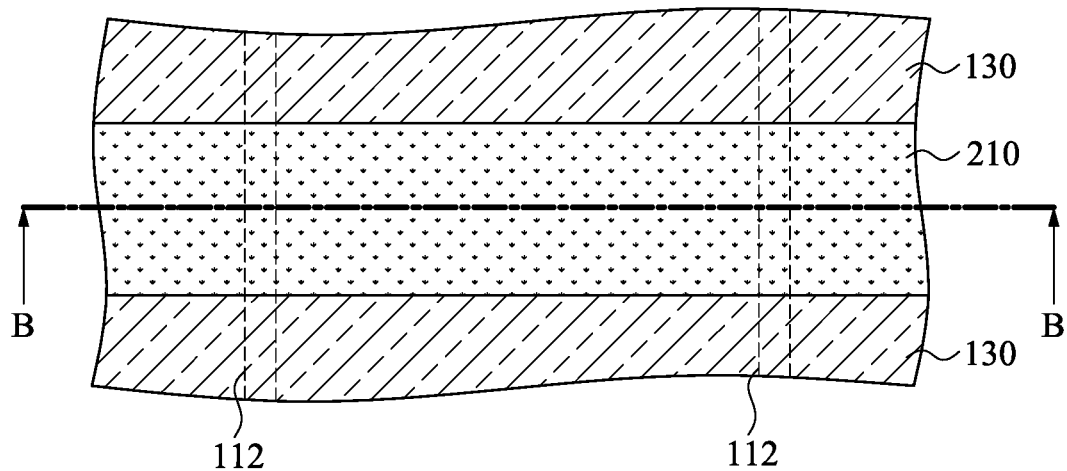
Figure 2B:
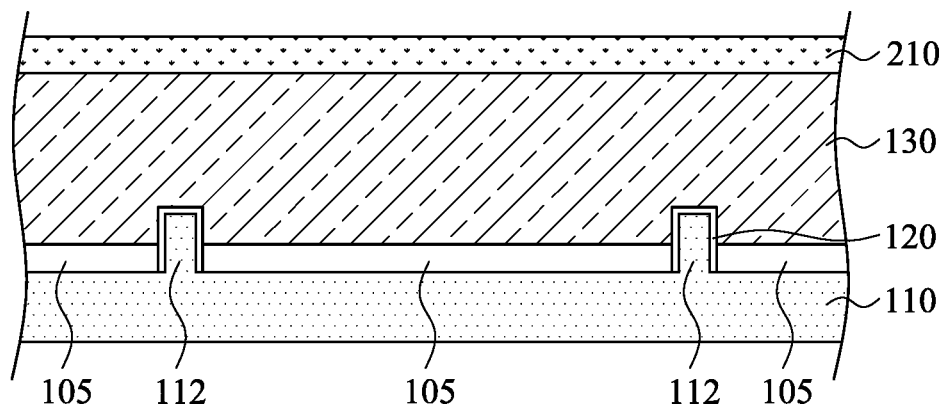

Reference is made to FIGS. 2A and 2B. A mask layer 210 is formed on the dummy gate layer 130 by suitable process (es) to a suitable thickness. The mask layer 210 covers a portion of the dummy gate layer 130 while leaves other portions of the dummy gate layer 130 uncovered. The mask layer 210, in some embodiments, is a hard mask layer which includes silicon oxide. The mask layer 210, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 100 Angstroms to about 500 Angstroms. In some other embodiments, the mask layer 210 may be a photo-resist layer. The photo-resist layer is deposited on the dummy gate layer 130, for example, by spin coating, and is used to form an intended pattern by way of irradiating, developing, drying, etching, and other suitable processes. In some embodiments, the mask layer 210 includes a silicon nitride layer disposed on the dummy gate layer 130 and an oxide layer disposed on the silicon nitride layer.

Figure 3A:
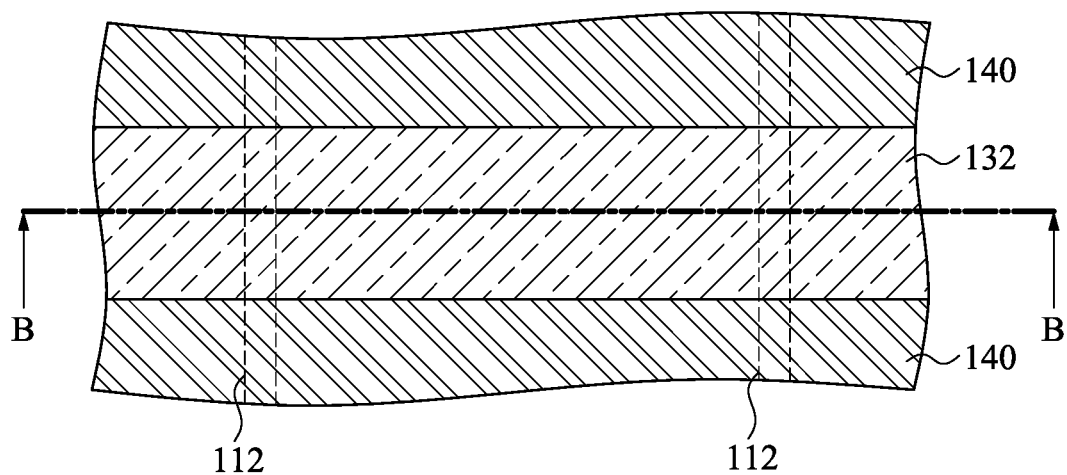
Figure 3B:
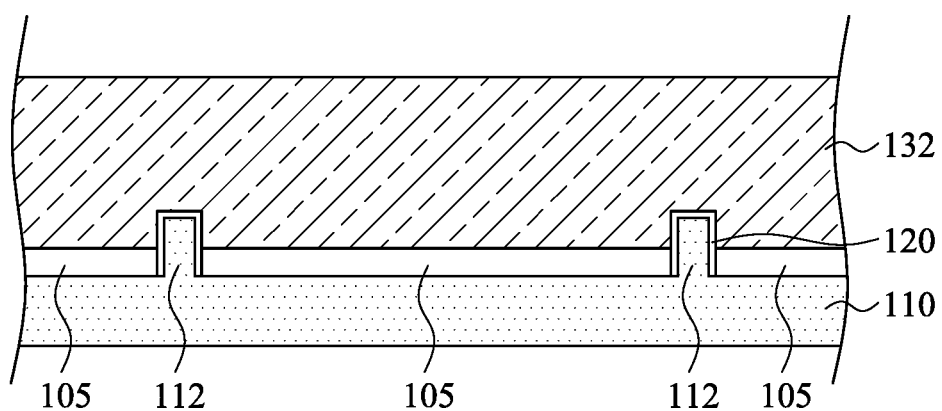

Reference is made to FIGS. 3A and 3B. A removing (or etch) process is performed to remove portions other than the intended pattern of the dummy gate layer 130 (see FIGS. 2A and 2B) (i.e., the portions uncovered by the mask layer 210) to form a dummy gate strip 132 by using the mask layer 210 (see FIGS. 2A and 2B) as a mask. In some embodiments, such an etch process may be performed multiple times. However, the patterning process is not limited to a photo-lithography process using photo-resists, and may be performed by an immersion lithography, electron beam lithography, or other suitable processes. As a result, the pattern of the dummy gate strip 132 as shown in FIG. 3A is obtained. In some embodiments, the mask layer 210 (see FIGS. 2A and 2B) is removed by an ashing, stripping, or other suitable technique.

A plurality of gate spacers 140 are formed on opposite sides 133 of the dummy gate strip 132. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 140 may include different materials with different etch characteristics than the dummy gate strip 132 so that the gate spacers 140 may be used as masks for the removing of portions of the dummy gate strip 132 (described below with references to FIGS. 4A and 4B). The gate spacers 140 may then be patterned, such as by one or more etches to remove the portions of the gate spacers 140 from the horizontal surfaces of the structure.

Figure 4A:
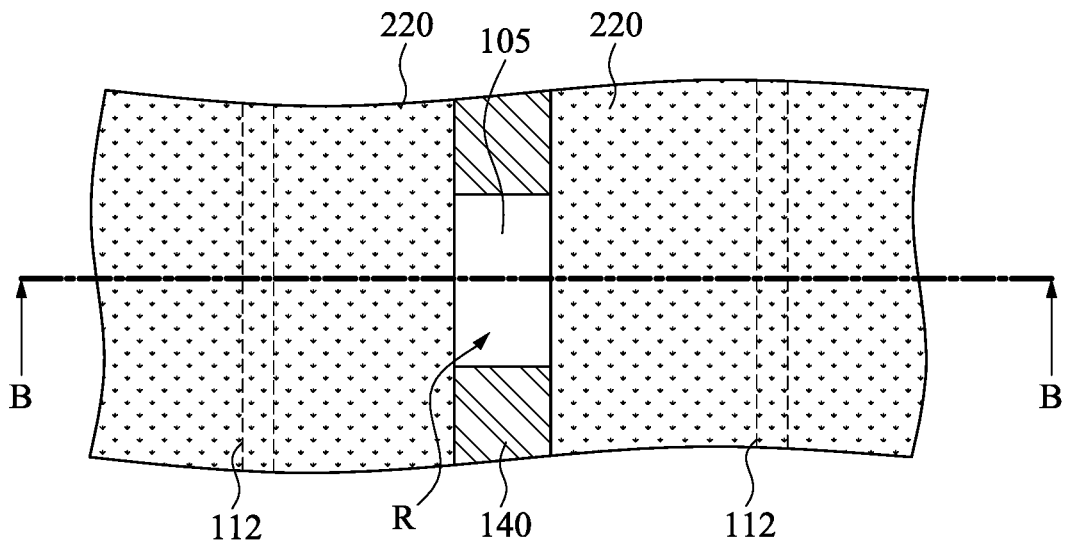
Figure 4B:
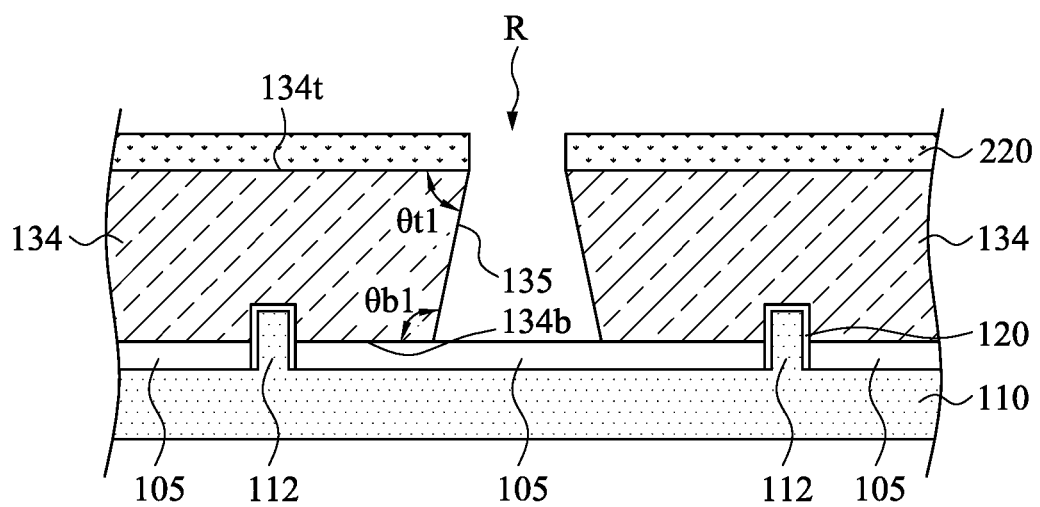

Reference is made to FIGS. 4A and 4B. Another mask layer 220 is formed on the structure of FIGS. 3A and 3B and is patterned to define at least one dummy gate structure 134. For example, the dummy gate strip 132 of FIGS. 3A and 3B is patterned to be two dummy gate structures 134, and a recess R is formed between the two dummy gate structures 134. The dummy gate structures 134 are present between the gate spacers 140. Moreover, the dummy gate structures 134 and the gate spacers 140 together define the recess R. The recess R exposes end sidewalls 135 of the dummy gate structures 134 and the isolation structure 105. In some embodiments, the mask layer 220 is a photoresist mask formed by depositing, exposing, and developing a layer of photoresist material. The mask layer 220 is patterned to form an insulation area (i.e., the recess R) between the dummy gate structures 134.

In FIG. 4B, at least one of the dummy gate structures 134 has a top surface 134t, a bottom surface 134b, and at least one end sidewall 135. The top surface 134t and the bottom surface 134b are opposite to each other, and the bottom surface 134b faces (or is adjacent to) the substrate 110 (and the interlayer dielectric 120 and/or the isolation structure 105). The top surface 134t and the end sidewall 135 intersect to form a top interior angle θt1. The term "interior angle" is an angle inside the dummy gate structure 134. The top interior angle θt1 is an acute angle. That is, the top interior angle θt1 is less than 90 degrees. Moreover, the bottom surface 134b and the end sidewall 135 intersect to form a bottom interior angle θb1. The bottom interior angle θb1 is an obtuse angle. That is, the bottom interior angle θb1 is greater than 90 degrees. Hence, the recess R gets wider toward the isolation structures 105 and the substrate 110.

Figure 5A:
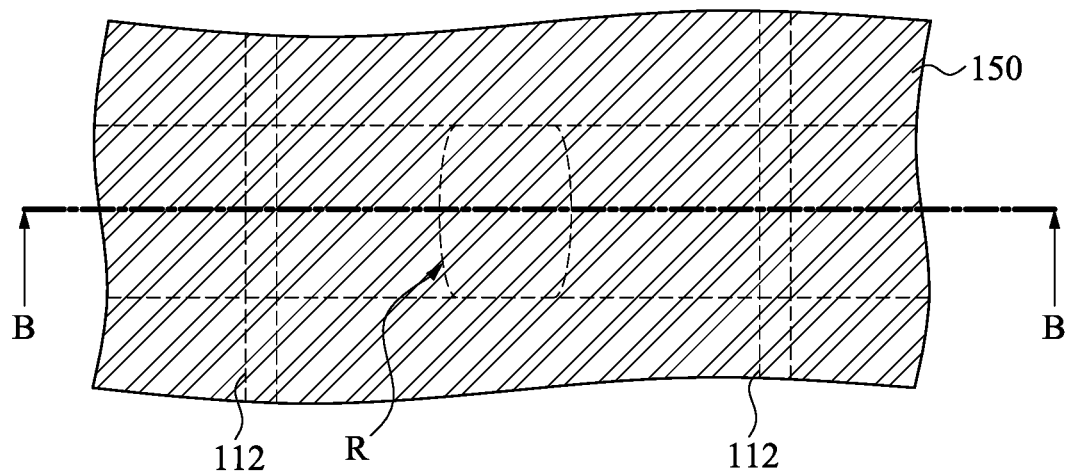
Figure 5B:
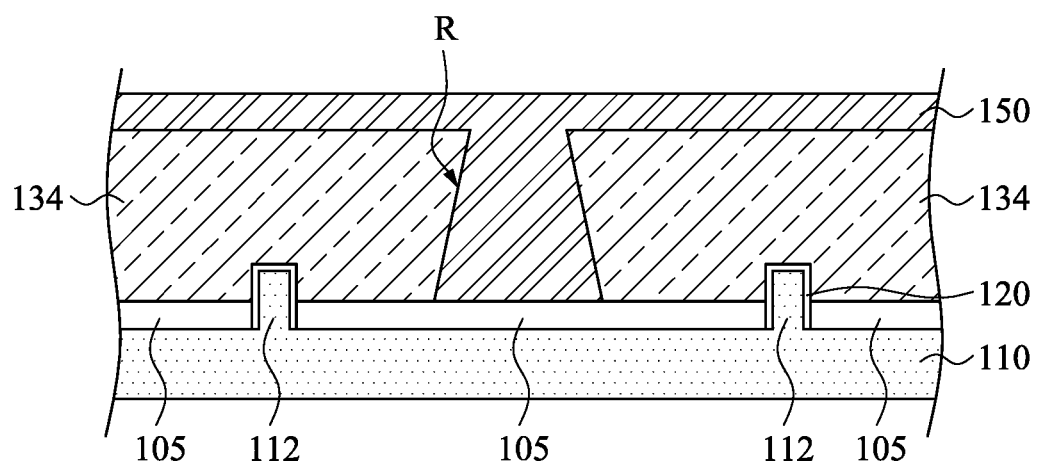

Reference is made to FIGS. 5A and 5B. A dielectric material 150 is deposited on the structure of FIGS. 5A and 5B and in the recess R. The dielectric material 150 may be various suitable dielectrics used as interlevel dielectrics (ILDs) or inter-metal dielectrics. In some embodiments, the dielectric material 150 may include an oxide material, such as silicon oxide. Depositing the dielectric material 150 includes using a CVD or PVD process. Depositing the dielectric material 150 may also include using a spin-on, such as a coating process.

Figure 6A:
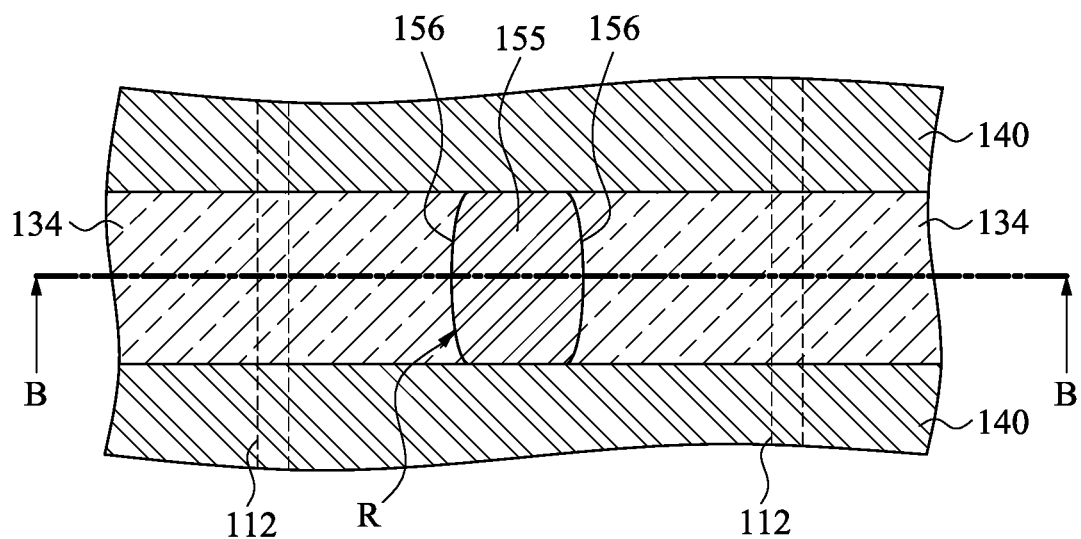
Figure 6B:
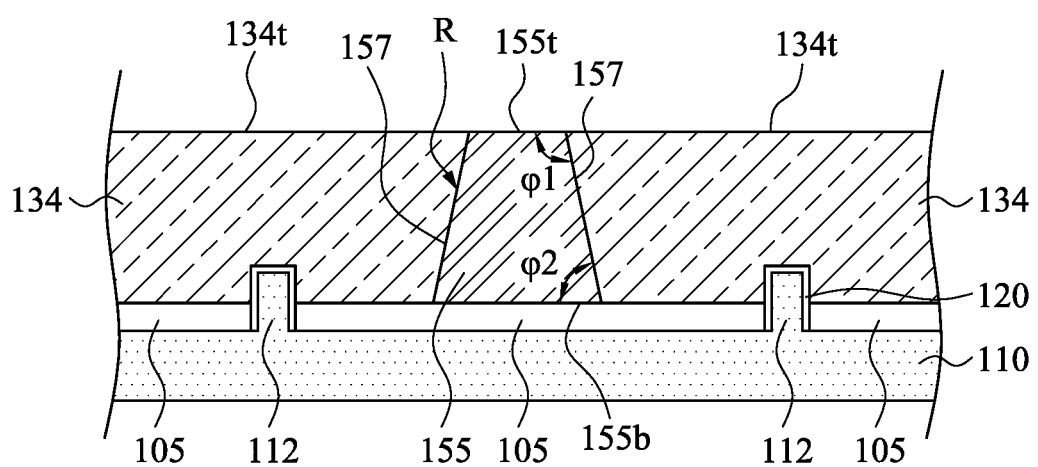

Reference is made to FIGS. 6A and 6B. A chemical mechanical polishing (CMP) process is performed on the dielectric material 150 of FIGS. 5A and 5B to etch back and planarize the dielectric material 150 until the dummy gate structures 134 are reached and exposed. The remaining dielectric material 150 in the recess R is referred as an insulating structure 155. In some embodiments, portions of the dummy gate structures 134 are removed during the CMP process. The insulating structure 155 has a top surface 155t. After the CMP process, the top surface 155t of the insulating structure 155 and the top surfaces 134t of the dummy gate structures 134 are substantially coplanar. The terms "substantially" as used herein may be applied to modify any quantitative representation which could permissibly vary without resulting in a change in the basic function to which it is related. For example, the top surface 155t of the insulating structure 155 and the top surfaces 134t of the dummy gate structures 134 as disclosed herein being substantially coplanar may permissibly vary within the scope of the disclosure if the top surface 155t of the insulating structure 155 and the top surfaces 134t of the dummy gate structures 134 are not structurally altered.

In FIG. 6B, the insulating structure 155 may be a plug which is surrounded by two adjacent gate spacers 140 and the two dummy gate structures 134. The insulating structure 155 has the top surface 155t and a bottom surface 155b opposite to each other. The bottom surface 155b faces the substrate 110 and the isolation structure 105. That is, the bottom surface 155b is adjacent to the isolation structure 105. In some embodiments, if the interlayer dielectric 120 is present on the isolation structure 105, the insulating structure 155 can be adjacent to the interlayer dielectric 120. In FIG. 6A, the top surface 155t of the insulating structure 155 has two opposite edges 156 respectively facing the dummy gate structures 134. Both of the edges 156 are curved outwardly. Furthermore, in FIG. 6B, an area of the bottom surface 155b is greater than an area of the top surface 155t. The insulating structure 155 has two opposite sidewalls 157 respectively facing the dummy gate structures 134. That is, one of the sidewalls 157 of the insulating structure 155 is adjacent to the end sidewall 135 (see FIG. 4B) of one of the dummy gate structures 134. The top surface 155t and the sidewall 157 of the insulating structure 155 intersect to form a top interior angle φ1. The term of "interior angle" herein is an angle inside the insulating structure 155. The top interior angle ω1 is substantially greater than 90 degrees, i.e., the top interior angle ω1 is an obtuse angle. Moreover, the bottom surface 155b and the sidewall 157 of the insulating structure 155 intersect to form a bottom interior angle ω2. The bottom interior angle ω2 is substantially smaller than 90 degrees, i.e., the bottom interior angle ω2 is an acute angle. Hence, the insulating structure 155 gets narrower toward the top surface 155t thereof, and gets wider toward the bottom surface 155b thereof. That is, the insulating structure 155 is tapered toward the top surface 155t thereof. In some embodiments, the insulating structure 155 has a width in a range of about 5 nm to about 500 nm, and the claimed scope of the present disclosure is not limited in this respect.

Figure 7A:
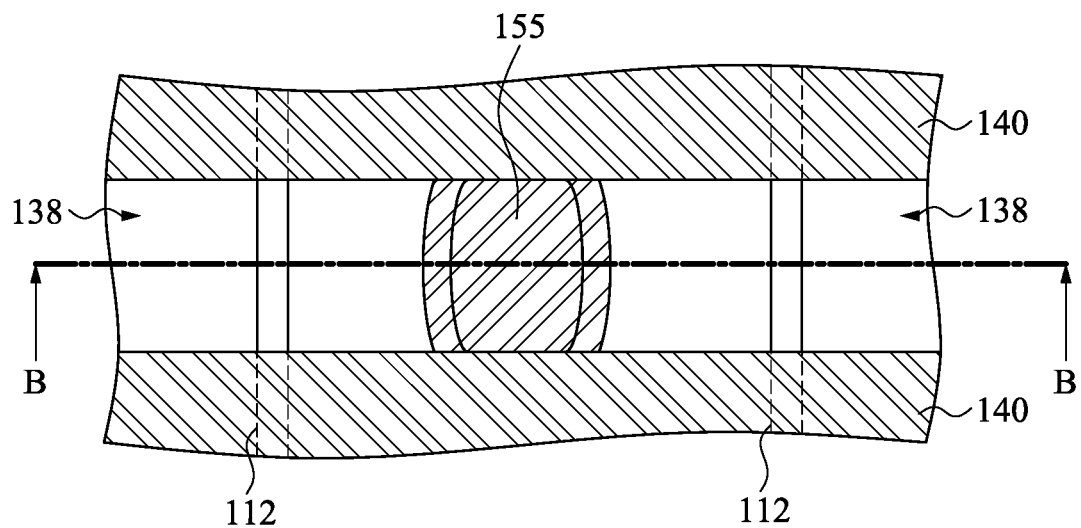
Figure 7B:
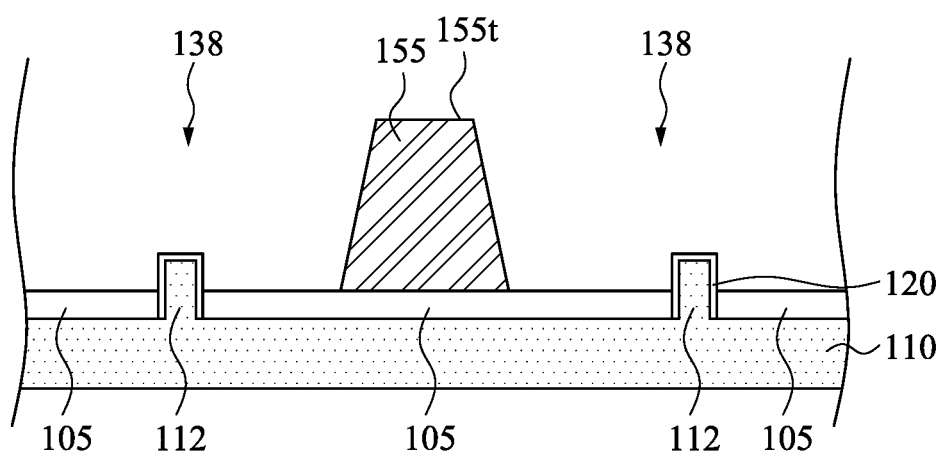

Reference is made to FIGS. 7A and 7B. In the present disclosure, a replacement gate (RPG) process scheme is employed. In some embodiments, in a RPG process scheme, a dummy polysilicon gate is formed first and is replaced later by a metal gate after high thermal budget processes are performed. The dummy gate structures 134 (see FIGS. 6A and 6B) are removed to form two openings 138 with the gate spacers 140 as their sidewalls. In some embodiments, portions of the interlayer dielectrics 120 exposed by the openings 138 are removed as well. Alternatively, in some embodiments, the dummy gate structures 134 are removed while the interlayer dielectric 120 retains as shown in FIG. 7B. For clarity, the interlayer dielectric 120 is depicted in FIG. 7B and is omitted in FIG. 7A. The dummy gate structures 134 (and the interlayer dielectric 120) may be removed by dry etch, wet etch, or a combination of dry and wet etch. For example, a wet etch process may include exposure to a hydroxide containing solution (e.g., ammonium hydroxide), deionized water, and/or other suitable etchant solutions.

In FIGS. 7A and 7B, the insulating structure 155 is tapered toward the top surface 155t thereof. Hence, the aperture of the opening 138 near the top surface 155t of the insulating structure 155 is larger than the aperture of the opening 138 near the bottom surface 155b of the insulating structure 155. With this configuration, metal gate structures 180 (see FIGS. 9A and 9B) are easy to be filled in the openings 138 without leaving spaces between the metal gate structures 180 and the insulating structure 155. Hence, the electrical performance of the metal gate structures 180 can be improved.

Figure 8A:
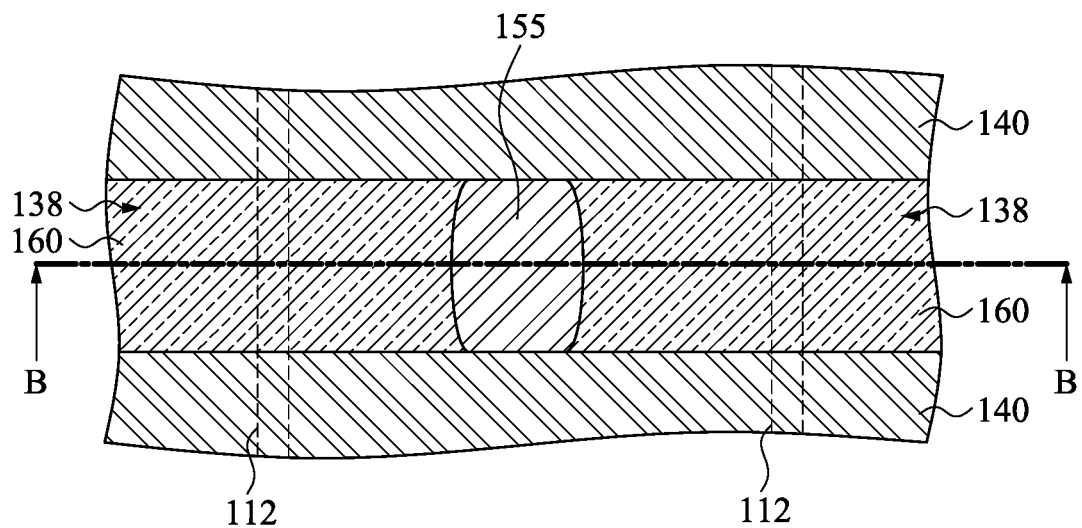
Figure 8B:
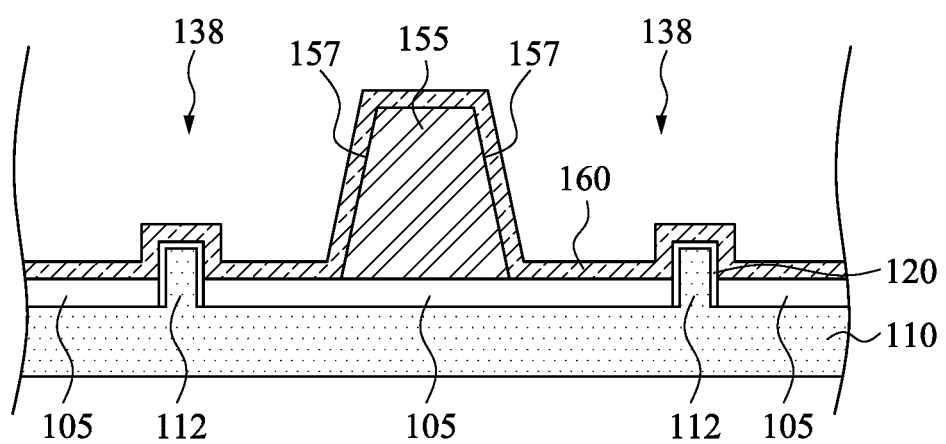

Reference is made to FIGS. 8A and 8B. A high dielectric constant (high-κ) dielectric layer 160 is conformally formed in the openings 138. Therefore, the high-κ dielectric layer 160 covers the semiconductor fins 112 and the sidewalls 157 of the insulating structure 155. In some embodiments, another interfacial layer is deposited first if the interlayer dielectric 120 of FIG. 7B is removed in a previous process step. The high-κ dielectric layer 160 has a dielectric constant (κ) higher than the dielectric constant of $SiO_2$, i.e. κ>3.9. The high-κ dielectric layer 160 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-κ dielectric layer 160 is deposited by suitable techniques, such as ALD, CVD, PVD, thermal oxidation, combinations thereof, or other suitable techniques.

Figure 9A:
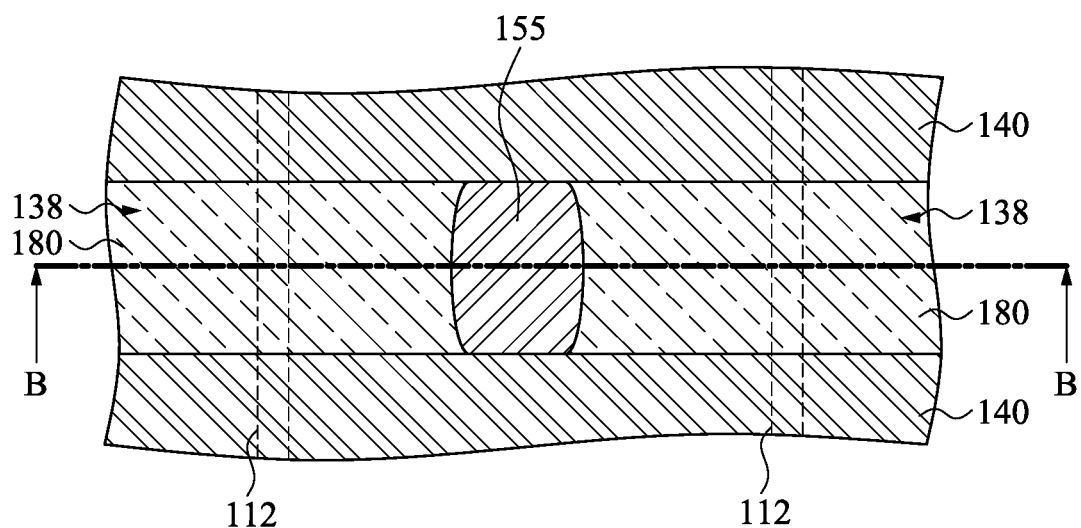
Figure 9B:
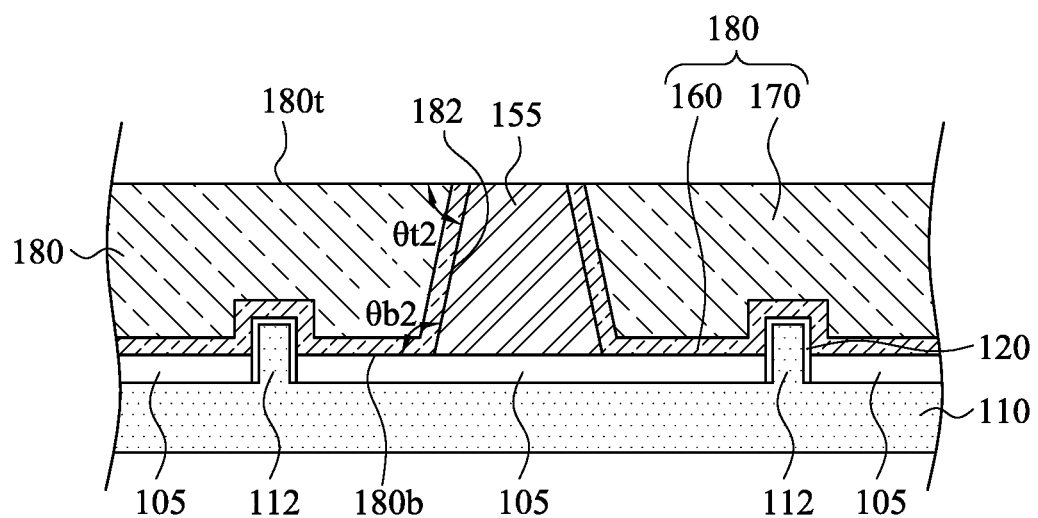

Reference is made to FIGS. 9A and 9B. At least one layer is formed in the openings 138 and on the high-κ dielectric layer 160. Subsequently, a metal chemical mechanical planarization (CMP) process is performed to etch back and planarize the layers to form two metal gate structures 180 respectively in the openings 138. One of the metal gate structures 180 includes the high-κ dielectric layer 160 and metal gate electrodes 170 present on the high-κ dielectric layer 160. The metal gate electrodes 170 formed may include capping layer(s), fill layer(s), and/or other suitable layers that are desirable in a metal gate stack. A work function metal layer included in the metal gate electrodes 170 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In some embodiments, the metal gate electrodes 170 formed is a p-type metal gate including a p-type work function layer. In some embodiments, the capping layer included in the metal gate electrodes 170 may include refractory metals and their nitrides (e.g. TiN, TaN, $W_2N$, TiSiN, TaSiN). The cap layer may be deposited by PVD, CVD, Metal-organic chemical vapor deposition (MOCVD) and ALD. In some embodiments, the fill layer included in the metal gate electrodes 170 may include tungsten (W). The metal layer may be deposited by ALD, PVD, CVD, or other suitable process.

In FIG. 9A, one of the metal gate structures 180 is surrounded by the gate spacers 140 and the insulating structure 155. The metal gate structures 180 are present between the gate spacers 140, and the insulating structure 155 is present between the gate spacers 140 and the metal gate structures 180. That is, the insulating structure 155 is surrounded by the metal gate structures 180 and the gate spacers 140. In FIG. 9B, at least one of the metal gate structures 180 has a top surface 180t, a bottom surface 180b, and at least one end sidewall 182. The top surface 180t and the bottom surface 180b are opposite to each other, and the bottom surface 180b faces (or is adjacent to) the substrate 110 and the interlayer dielectric 120 and/or the isolation structure 105. The end sidewall 182 of the metal gate structure 180 is adjacent to the insulating structure 155. The top surface 180t and the end sidewall 182 of the metal gate structure 180 intersect to form a top interior angle θt2. The term "interior angle" is an angle inside the metal gate structure 180. The top interior angle θt2 is an acute angle. That is, the top interior angle θt2 is less than 90 degrees. Moreover, the bottom surface 180b and the end sidewall 182 of the metal gate structure 180 intersect to form a bottom interior angle θb2. The bottom interior angle θb2 is an obtuse angle. That is, the bottom interior angle θb2 is greater than 90 degrees.

Thereafter, additional processes may be performed to manufacture the semiconductor device. For example, the metal gate structures 180 may be doped, portions of the metal gate structures 180 may be silicided, inter-layer dielectric (ILD) layers/and inter-metal dielectric (IMD) layers may be formed, metallization layers may be formed, and the like.

According to the aforementioned embodiments, the insulating structure is tapered toward the top surface thereof. Hence, the aperture of the opening near the top surface of the insulating structure is larger than the aperture of the opening near the bottom surface of the insulating structure. With this configuration, the metal gate structures are easy to be filled in the openings without leaving spaces between the metal gate structures and the insulating structure. Hence, the electrical performance of the metal gate structures can be improved.

Figure 10A:
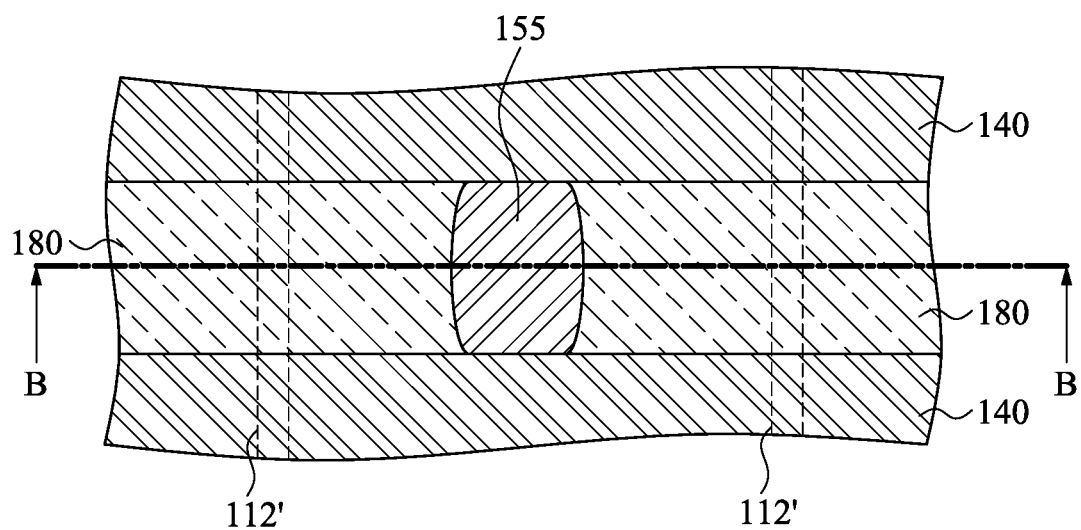
FIG. 10A is a top view of a semiconductor device in accordance with some embodiments of the present disclosure.
Figure 10B:
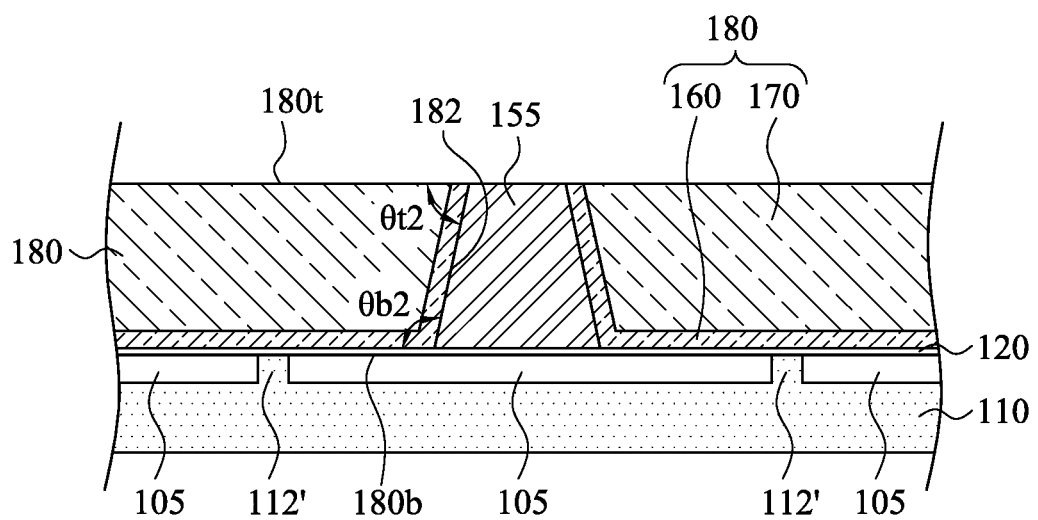
FIG. 10B is a cross-sectional view taking along line B-B of FIG. 10A.

FIG. 10A is a top view of a semiconductor device in accordance with some embodiments of the present disclosure, and FIG. 10B is a cross-sectional view taking along line B-B of FIG. 10A. The difference between FIGS. 10A, 10B and 9A, 9B pertains to the configuration of active regions of the semiconductor device. In FIGS. 9A and 9B, the active regions are semiconductor fins 112, while in FIGS. 10A and 10B, the active regions are oxide defined (OD) regions 112'. The oxide defined regions 112' are surrounded by or at least adjacent to the isolation structures 105. The oxide defined regions 112' can be formed in the substrate 110. The oxide defined regions 112' can be doped regions, and the claimed scope is not limited in this respect. In FIG. 10A, one of the metal gate structures 180 is surrounded by the gate spacers 140 and the insulating structure 155. The metal gate structures 180 are present between the gate spacers 140, and the insulating structure 155 is present between the gate spacers 140 and the metal gate structures 180. That is, the insulating structure 155 is surrounded by the metal gate structures 180 and the gate spacers 140. In FIG. 10B, at least one of the metal gate structures 180 has a top surface 180t, a bottom surface 180b, and at least one end sidewall 182. The top surface 180t and the bottom surface 180b are opposite to each other, and the bottom surface 180b faces (or is adjacent to) the substrate 110 and the interlayer dielectric 120 and/or the isolation structure 105. The end sidewall 182 of the metal gate structure 180 is adjacent to the insulating structure 155. The top surface 180t and the end sidewall 182 of the metal gate structure 180 intersect to form a top interior angle θt2. The term "interior angle" is an angle inside the metal gate structure 180. The top interior angle θt2 is an acute angle. That is, the top interior angle θt2 is less than 90 degrees. Moreover, the bottom surface 180b and the end sidewall 182 of the metal gate structure 180 intersect to form a bottom interior angle θb2. The bottom interior angle θb2 is an obtuse angle. That is, the bottom interior angle θb2 is greater than 90 degrees. The manufacturing processes and other structural details of FIGS. 10A and 10B are similar to FIGS. 9A and 9B, and therefore, a description in this regard will not be provided hereinafter.

According to some embodiments, a semiconductor device includes a substrate, at least one active region, at least one gate structure, and an insulating structure. The active region is present at least partially in the substrate. The gate structure is present on the active region. The gate structure has at least one end sidewall and a top surface intersecting to form a top interior angle. The top interior angle is an acute angle. The insulating structure is present adjacent to the end sidewall of the gate structure and on the substrate.

According to some embodiments, a semiconductor device includes a substrate, at least two active regions, at least two gate structures, and an insulating structure. The active regions are present at least partially in the substrate. The gate structures are respectively present on the active regions. The insulating structure is present between the gate structures. The insulating structure has a top surface. The insulating structure gets narrower toward the top surface of the insulating structure.

According to some embodiments, a method for manufacturing a semiconductor device includes forming at least one active region at least partially in a substrate. A gate layer is formed on the substrate and the active region. The gate layer is patterned to form at least one gate structure and a recess adjacent to the gate structure. The gate structure has a top surface and an end sidewall adjacent to the recess. The end sidewall and the top surface intersect to form a top interior angle, and the top interior angle is an acute angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   an active region;
   a gate structure over the active region and on the substrate, wherein the gate structure comprises a dielectric layer and a gate electrode; and
   an insulating structure over the substrate, wherein:
      a first portion of the insulating structure has a first width,
      a second portion of the insulating structure has a second width less than the first width,
      the second portion is above the first portion,
      the insulating structure has a first sidewall facing the active region, and
      the dielectric layer is disposed laterally between the gate electrode and the first sidewall of the insulating structure.

2. The semiconductor device of claim 1, wherein the dielectric layer is in contact with the first sidewall of the insulating structure.

3. The semiconductor device of claim 1, comprising an interlayer dielectric disposed between the dielectric layer and the active region.

4. The semiconductor device of claim 1, wherein:
   the gate structure has a first sidewall and a top surface intersecting to form a top interior angle, and
   the top interior angle is an acute angle.

5. The semiconductor device of claim 1, comprising an isolation structure under the gate structure and adjacent to the active region, wherein the insulating structure contacts the isolation structure.

6. The semiconductor device of claim 5, comprising an interlayer dielectric disposed between the isolation structure and the active region.

7. The semiconductor device of claim 1, wherein the dielectric layer separates the gate electrode from the insulating structure.

8. A semiconductor device, comprising:
   a substrate;
   a first gate structure and a second gate structure over the substrate, wherein the first gate structure comprises a gate electrode and a dielectric layer underlying the gate electrode;
   a gate spacer extending continuously from the first gate structure to the second gate structure; and
   an insulating structure between the first gate structure and the second gate structure, wherein:
      the insulating structure is in contact with the gate spacer, and
      the dielectric layer is laterally coplanar with a sidewall of the insulating structure.

9. The semiconductor device of claim 8, wherein:
   the dielectric layer separates the insulating structure from the gate electrode.

10. The semiconductor device of claim 8, comprising:
    an isolation structure, wherein the insulating structure is in contact with the isolation structure.

11. The semiconductor device of claim 8, comprising:
    an isolation structure, wherein:
       the dielectric layer separates the insulating structure from the gate electrode, and
       the dielectric layer separates the isolation structure from the gate electrode.

12. The semiconductor device of claim 8, wherein the dielectric layer is in contact with the sidewall of the insulating structure and a sidewall of the gate electrode.

13. The semiconductor device of claim 8, wherein the insulating structure has a tapered sidewall facing the gate electrode.

14. A method for manufacturing a semiconductor device, the method comprising:
    forming an active region;
    forming a gate strip over the active region;
    forming a gate spacer adjacent to the gate strip;
    forming a first mask layer over a first portion of the gate strip and a first portion of the gate spacer, wherein a second portion of the gate strip and a second portion of the gate spacer are exposed through the first mask layer;
    patterning the gate strip to form a gate structure over the active region and a first recess adjacent to the gate structure, wherein the second portion of the gate strip is removed to form the first recess;
    forming a dielectric material in the first recess to define an insulating structure;
    removing the gate structure to form a second recess and expose a sidewall of the first portion of the gate spacer;
    forming a dielectric layer in the second recess; and
    forming a gate electrode overlying the dielectric layer in the second recess, wherein the gate electrode is spaced apart from the insulating structure by the dielectric layer.

15. The method of claim 14, wherein patterning the gate strip comprises exposing a sidewall of the second portion of the gate spacer.

16. The method of claim 15, wherein the forming a dielectric material comprises forming the dielectric material to contact the sidewall of the second portion of the gate spacer.

17. The method of claim 14, wherein the first portion of the gate strip overlies the active region and the first mask layer overlies the active region.

18. The method of claim 14, wherein the patterning comprises patterning the gate strip to have a tapered sidewall.

19. The method of claim 14, wherein:
- the forming a dielectric layer comprises forming the dielectric layer over the insulating structure, and
- the method comprises removing a portion of the dielectric layer to expose a top surface of the insulating structure.

20. The method of claim 14, wherein removing the gate structure comprises exposing a sidewall of the insulating structure.

* * * * *